(12) United States Patent
McCaughey et al.

(10) Patent No.: US 7,205,809 B2
(45) Date of Patent: Apr. 17, 2007

(54) LOW POWER BUS-HOLD CIRCUIT

(75) Inventors: Thomas V. McCaughey, Sherman, TX (US); Eugene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 11/100,854

(22) Filed: Apr. 7, 2005

(65) Prior Publication Data
US 2006/0226884 A1 Oct. 12, 2006

(51) Int. Cl.
*H03K 3/12* (2006.01)
(52) U.S. Cl. .................. 327/199; 326/86; 327/333
(58) Field of Classification Search ............... 327/333, 327/538, 199; 326/86, 90
See application file for complete search history.

(56) References Cited

U.S. PATENT DOCUMENTS 6,097,229 A * 8/2000 Hinterscher ................. 327/199
6,345,380 B1 * 2/2002 Bonaccio et al. ............. 716/12
6,351,174 B2 * 2/2002 Soltero et al. ............... 327/333

* cited by examiner

*Primary Examiner*—Dinh T. Le
(74) *Attorney, Agent, or Firm*—Alan K. Stewart; W. James Brady; Frederick J. Telecky, Jr.

(57) ABSTRACT

A low power bus hold circuit includes: a first inverter having an input coupled to a bus hold input node; and a second inverter having a first input coupled to a first output of the first inverter and a second input coupled to a second output of the first inverter, wherein the first and second outputs of the first inverter are separated by a resistor, and having an output coupled to the bus hold input node.

12 Claims, 2 Drawing Sheets

LOW POWER BUS-HOLD CIRCUIT

FIELD OF THE INVENTION

The present invention relates to electronic circuitry and, in particular, to low power bus-hold circuits.

BACKGROUND OF THE INVENTION

Bus hold is the ability of either an input pin or an I/O pin to retain the last valid logic state (voltage level) after the source driving it either enters the high impedance state, or is removed. There are four minimum current specifications that define Bus Hold. Two are sustaining currents that the node must source or sink without changing state, and two are overdrive currents that will cause the node to change state. IBHL is defined as "Bus Hold LOW sustaining current." The bus hold circuit must sink at least this minimum LOW sustaining current when the input voltage is at the maximum level for a LOW logic state. IBHH is defined as "Bus Hold HIGH sustaining current." The Bus Hold circuit must source at least this minimum HIGH sustaining current when the input voltage is at the minimum level for a HIGH logic state. IBHLO is defined as "Bus Hold LOW overdrive current." An external driver must source at least IBHLO to switch the node from LOW to HIGH. IBHHO is defined as "Bus Hold HIGH overdrive current." An external driver must sink at least IBHHO to switch the node from HIGH to LOW.

A prior art Bus-Hold circuit is shown in FIG. 1. The circuit of FIG. 1 includes transistors MP1, MN1, MPH1, MNH1, diode D1, resistor R3A, and input io. One of the problems with the prior art bus-hold solution in FIG. 1, is that it turns "on" and "off" the current source of the bus-hold circuit at the same time, causing switching current in the current source. It also does not have a current limiting resistor in the switching path of the current source. This causes a higher power dissipation capacitance while increasing the bus-hold current range.

SUMMARY OF THE INVENTION

A low power bus hold circuit includes: a first inverter having an input coupled to a bus hold input node; and a second inverter having a first input coupled to a first output of the first inverter and a second input coupled to a second output of the first inverter, wherein the first and second outputs of the first inverter are separated by a resistor, and having an output coupled to the bus hold input node.

DETAILED DESCRIPTION OF PREFERRED EMBODIMENTS

A low power bus-hold circuit, according to the present invention, provides a smaller IBHHO/IBHLO current while maintaining the IBHH/IBHL minimum bus-hold current limit. This way an external driver can sink less current (IBHHO) to switch the input node from high to low and can source less current (IBHLO) to switch the input node from low to high, while preserving minimum high (IBHH) and minimum low (IBHL) sustaining current of the bus-hold circuit. This solution can also reduce the power dissipation capacitance of a bus-hold device by reducing the switching current in the bus-hold circuit.

Figure 2:
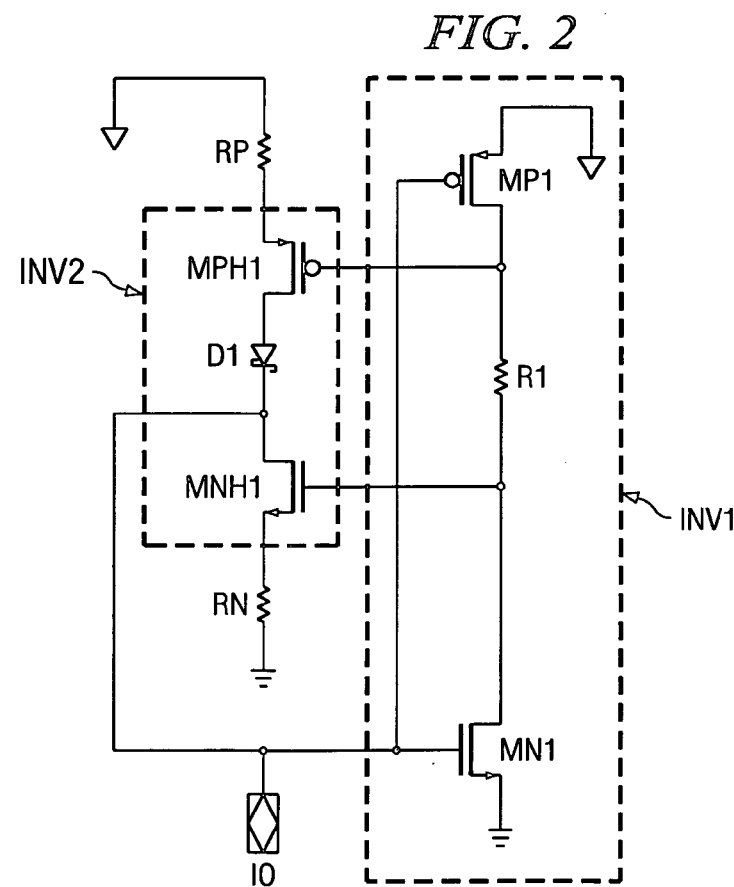
FIG. 2 is a circuit diagram of a preferred embodiment low power bus-hold circuit.

The low power bus-hold circuit, according to the present invention, is shown in FIG. 2. The circuit of FIG. 2 includes inverter INV1 which includes PMOS transistor MP1, NMOS transistor MN1, and resistor R1; inverter INV2 which includes transistor MPH1, transistor MNH1, and diode D1; resistors RP and RN; and input signal io. Signal io is attached to the input/IO of the bus-hold device. When signal io is in a LOW state, N-channel device MN1 is in the OFF state and P-channel device MP1 is in the ON state and turning N-channel device MNH1 ON and P-channel device MPH1 OFF. This causes the bus-hold to latch to a LOW state. When signal io is in a HIGH state, N-channel device MN1 is in the ON state and P-channel device MP1 is in the OFF state and turning N-channel device MNH1 OFF and P-channel device MPH1 ON. This causes the bus-hold to latch to a HIGH state. Device D1 is a current blocking diode.

During a low to high transition N-channel device MN1 goes to an ON state and quickly turns OFF the pull-down holding transistor MNH1. Resistor R1 causes N-channel device MN1 to turn ON the pull-up holding transistor MPH1 at a slightly later time. The delayed turn on of transistor MPH1 helps limit the IBHHO current while helping maintain the IBHH current. Since pull-down holding transistor MNH1 was turned to the OFF state before pull-up holding transistor MPHI was turned ON, there was very little through current through transistors MPH1/MNH1 to ground. During this transition, resistor R1 not only slightly delays the turn on of pull-up holding transistor MPH1, but also becomes a current limiting resistor for the switching path formed by transistors MP1 and MN1.

During a high to low transition P-channel device MP1 goes to an ON state and quickly turns OFF the pull-up holding transistor MPH1. Resistor R1 causes P-channel device MP1 to turn ON the pull-down holding transistor MNH1 at a slightly later time. The delayed turn ON of transistor MNH1 helps limit the IBHLO current while helping maintain the IBHL current. Since pull-up holding transistor MPH1 was turned to the OFF state before pull-down holding transistor MNH1 was turned ON, there was very little through current through transistors MPH1/MNH1 to ground. Again, during this transition, resistor R1 not only slightly delays the turn on of pull-down holding transistor MNH1 but also becomes a current limiting resistor for the switching path formed by transistors MP1 and MN1. Limiting the current in the current switching paths helps reduce the power dissipation capacitance.

The low power bus-hold, according to the present invention, can have a lower IBHHO/IBHLO current while maintaining close IBHH/IBHL currents, as compared to the standard bus-hold.

When the bus-hold input is switching, this solution turns OFF the current source (sustaining current) in the bus-hold latch, then at a slightly later time turns ON the sustaining current by using a delay resistor Rl. This solution also has the current limiting resistors RP and RN in the switching path of the current source of the bus-hold. These advantages help reduce the power dissipation capacitance in a bus-hold device while optimizing the current range of the bus-hold circuit.

Figure 1:
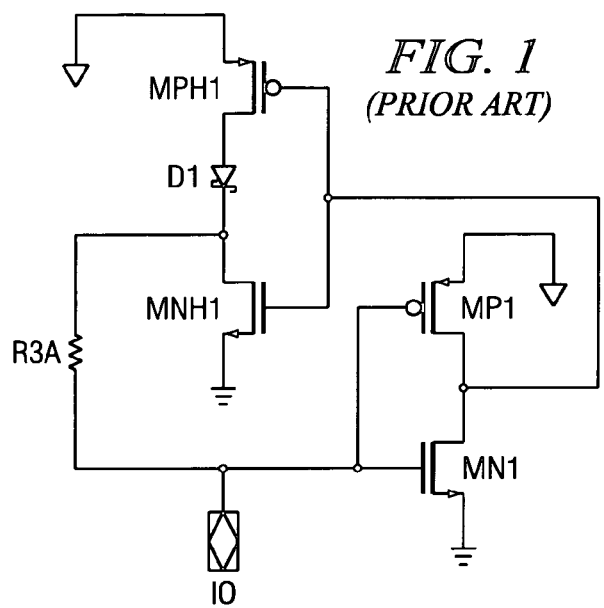
FIG. 1 is a circuit diagram of a prior art bus-hold circuit.
Figure 3:
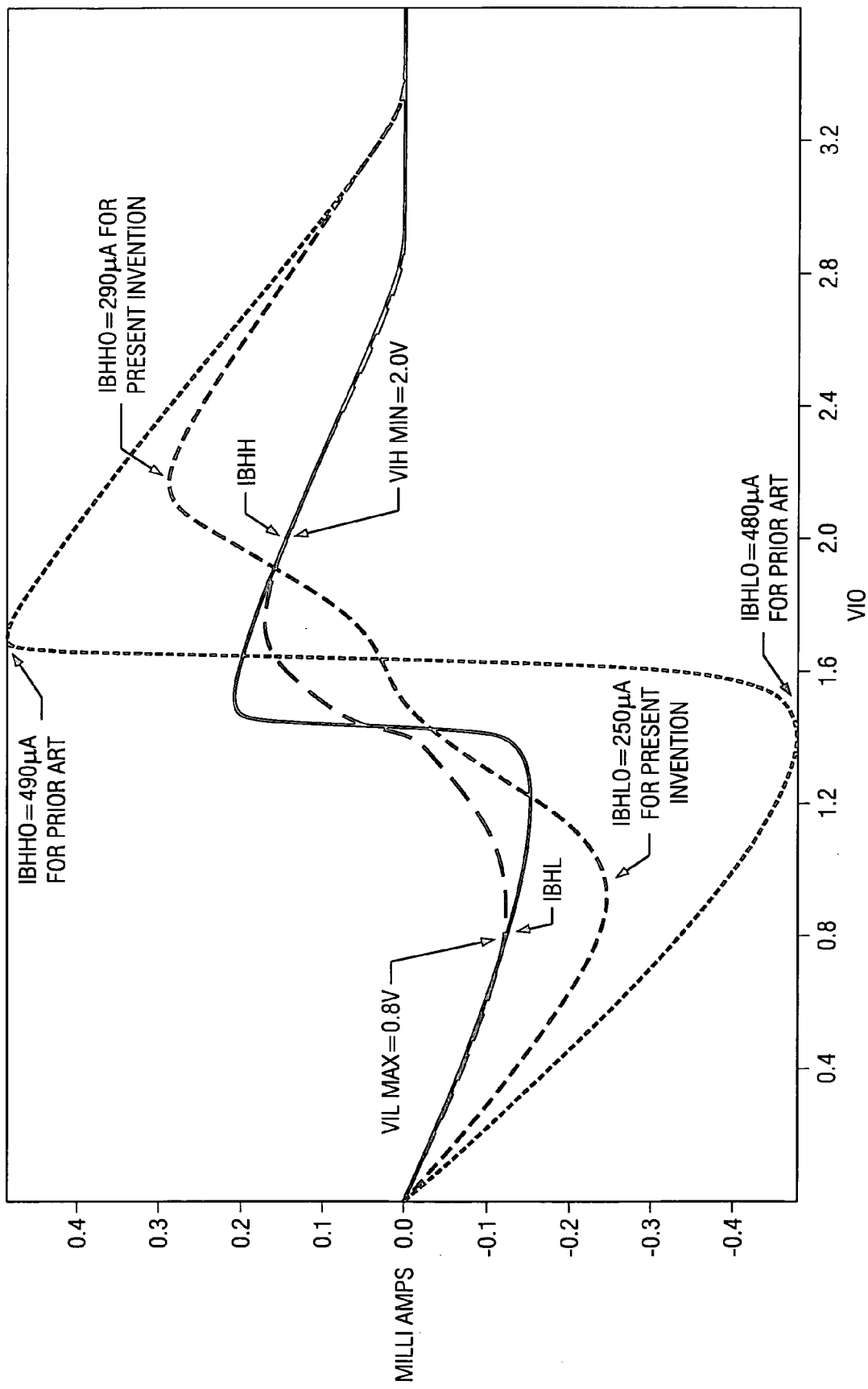
FIG. 3 is a plot showing an example comparison of the prior art of FIG. 1 with the preferred embodiment of FIG. 2.

FIG. 3 is a plot showing an example comparison of the prior art of FIG. 1 with the present invention of FIG. 2. The solid lines represent the present invention of FIG. 2. The dashed lines represent the prior art of FIG. 1. Input voltage VIL max is the maximum voltage level for a LOW logic state. Input voltage VIH min is the minimum voltage level for a HIGH logic state.

This solution reduces the power dissipation capacitance of a bus-hold device by reducing the switching current in the bus-hold circuit. It also provides a smaller IBHH/IBHLO current while maintaining the IBHH/IBHL minimum bus-hold current limit. This way an external driver can sink less current (IBHHO) to switch the input node from high to low and can source less current (IBHLO) to switch the input node from low to high, while preserving minimum high (IBHH) and minimum low (IBHL) sustaining current of the bus-hold circuit. This becomes a desirable solution when using a bus-hold in a device with very low power dissipation capacitance specifications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bus hold circuit comprising:
    a first inverter having an input coupled to a bus hold input node; and
    a second inverter having a first input coupled to a first output of the first inverter and a second input coupled to a second output of the first inverter, wherein the first and second outputs of the first inverter are separated by a resistor, and having an output coupled to the bus hold input node.

2. The circuit of claim 1 further comprising:
    a first current limiting resistor coupled between the second inverter and a first supply node; and
    a second current limiting resistor coupled between the second inverter and a second supply node.

3. The circuit of claim 1 wherein the first inverter comprises:
    a P channel device coupled between a first end of the resistor and a first supply node; and
    an N channel device coupled between a second end of the resistor and a second supply node.

4. The circuit of claim 3 wherein a control node of the P channel device is coupled to the bus hold input node, and a control node of the N channel device is coupled to the bus hold input node.

5. The circuit of claim 3 wherein the first input of the second inverter is coupled to the first end of the resistor, and the second input of the second inverter is coupled to the second end of the resistor.

6. The circuit of claim 1 wherein the second inverter comprises:
    a P channel device coupled between the bus hold input node and a first supply node; and
    an N channel device coupled between the bus hold input node and a second supply node.

7. The circuit of claim 6 further comprising:
    a first current limiting resistor coupled between the P channel device and the first supply node; and
    a second current limiting resistor coupled between the N channel device and the second supply node.

8. The circuit of claim 6 further comprising a diode coupled between the P channel device and the N channel device.

9. The circuit of claim 6 wherein a control node of the P channel device is coupled to a first end of the resistor and a control node of the N channel device is coupled to a second end of the resistor.

10. A bus hold circuit comprising:
    a first P channel transistor having a control node coupled to a bus hold input node;
    a first resistor having a first end coupled to the first P channel transistor;
    an N channel transistor coupled to a second end of the first resistor, and having a control node coupled to the bus hold input node;
    a second P channel transistor coupled to the bus hold input node, and having a control node coupled to the first end of the first resistor; and
    a second N channel transistor coupled in series with the second P channel transistor, and having a control node coupled to the second end of the first resistor.

11. The circuit of claim 10 further comprising a diode coupled between the second P channel transistor and the second N channel transistor.

12. The circuit of claim 10 further comprising:
    a first current limiting resistor coupled between the second P channel transistor and a first supply node; and
    a second current limiting resistor coupled between the second N channel transistor and a second supply node.

* * * * *